United States Patent
Lee et al.

(10) Patent No.: US 9,231,032 B2
(45) Date of Patent: Jan. 5, 2016

(54) ORGANIC ELECTROLUMINESCENT DEVICE AND METHOD OF FABRICATING THE SAME

(71) Applicant: LG Display Co., Ltd., Seoul (KR)

(72) Inventors: A Ryoung Lee, Seoul (KR); Hong Myeong Jeon, Goyang-si (KR); Geum Young Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/453,600

(22) Filed: Aug. 6, 2014

(65) Prior Publication Data

US 2015/0179713 A1    Jun. 25, 2015

(30) Foreign Application Priority Data

Dec. 24, 2013  (KR) .................. 10-2013-0162030
Jul. 24, 2014   (KR) .................. 10-2014-0094136

(51) Int. Cl.
 *H01L 35/24*    (2006.01)
 *H01L 27/32*    (2006.01)
 *H01L 51/56*    (2006.01)

(52) U.S. Cl.
 CPC ........ *H01L 27/3211* (2013.01); *H01L 27/3262* (2013.01); *H01L 51/56* (2013.01)

(58) Field of Classification Search
 CPC ............ H01L 27/3206; H01L 27/3211; H01L 27/3218
 USPC ................................. 257/40, 88, 89
 See application file for complete search history.

(56) References Cited

U.S. PATENT DOCUMENTS

| | | | |
|---|---|---|---|
| 6,768,482 B2 * | 7/2004 | Asano et al. ............... | 345/90 |
| 2006/0267490 A1 * | 11/2006 | Hong et al. ............... | 313/506 |
| 2009/0140253 A1 * | 6/2009 | Kasahara .................. | 257/59 |
| 2014/0077186 A1 * | 3/2014 | Kim ........................... | 257/40 |
| 2015/0001514 A1 * | 1/2015 | Goto ......................... | 257/40 |

* cited by examiner

*Primary Examiner* — Matthew E Warren
(74) *Attorney, Agent, or Firm* — Fenwick & West LLP

(57) ABSTRACT

An organic electroluminescent device is disclosed which includes: first and second pixel regions defined by first and second gate lines and data lines crossing each other; first sub-pixels arranged in the first pixel region close to the first gate line; first driving cells arranged between the first sub-pixels; second sub-pixels arranged in the second pixel region close to the second gate line; and second driving cells arranged between the second sub-pixels.

12 Claims, 9 Drawing Sheets

ORGANIC ELECTROLUMINESCENT DEVICE AND METHOD OF FABRICATING THE SAME

CROSS REFERENCE TO RELATED APPLICATION

The present application claims priority under 35 U.S.C. §119(a) of Korean Patent Applications No. 10-2013-0162030 filed on Dec. 24, 2013, and Korean Patent Applications No. 10-2014-0094136 filed on Jul. 24, 2014, which are both hereby incorporated by reference in their entirety.

BACKGROUND

1. Field of the Disclosure

The present application relates to an organic electroluminescent device. More particularly, the present application relates to an organic electroluminescent device with an improved pixel structure.

2. Description of the Related Art

With the development of information communication, display devices are being rapidly developed. Among the display devices, an organic electroluminescent device corresponding to a self-luminous device does not require a separated backlight unit. As such, the organic electroluminescent device has features of thinner and lower consumption power compared to the other display devices.

An ordinary organic electroluminescent device can basically include an anode electrode, a cathode electrode and an organic light emission pattern interposed between the two electrodes. The ordinarily organic electroluminescent device allows excitons to be formed through recombination of electrons and electric holes, which are applied from the anode electrode and the cathode electrode, in the organic light emission pattern. Also, the ordinarily organic electroluminescent device generates light by transitioning the excitons from an unstable state (or an excited state) into a stable state (a ground state).

The organic light emission pattern, which performs the function of light emission, is formed on a large-sized substrate through an ink-jet printing procedure, in order to form pixels.

Each of the pixels included in an organic electroluminescent device of the related art is configured with red, green and blue sub-pixels and driving cells disposed between the red, green and blue sub-pixels. In order to form the sub-pixels, a nozzle scans sub-pixel regions in a horizontal direction of the substrate and drops ink into sub-pixel regions. However, the vertical lengths of the red, green and blue sub-pixels must be shortened due to the driving cells. As such, the nozzle must repeatedly perform the scanning operation four times, in order to drop 8 drops of ink into each of the sub-pixel regions. Due to this, processing time increases.

BRIEF SUMMARY

Accordingly, embodiments of the present application are directed to an organic electroluminescent device and a fabrication method thereof that substantially obviate one or more of problems due to the limitations and disadvantages of the related art.

The embodiments are to provide an organic electroluminescent device and a fabrication method thereof that are adapted to reduce processing time at the formation of pixels.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In one embodiment, an organic electroluminescent device comprises a plurality of first light emitting sub-pixels arranged in a row along a first direction. A plurality of second light emitting sub-pixels are arranged in the row along the first direction. The first light emitting sub-pixels are offset from the second light emitting sub-pixels in a second direction that is perpendicular to the first direction.

In one embodiment, the first sub-pixels are offset from the second sub-pixels by more than half a nozzle pitch, the nozzle pitch being a distance between ink nozzles used to supply pigment onto the first and second sub-pixels.

In one embodiment, groups of the first sub-pixels alternate with groups of the second sub-pixels along the first direction. In another embodiment, individual first sub-pixels alternate with individual second sub-pixels along the first direction.

In one embodiment, a first gate line extends along the first direction and adjacent to a first side of the row. A second gate line extends along the first direction and adjacent to a second side of the row. In one embodiment, the first gate line includes a first section, a second section that is offset from the first section in the second direction, and a transition section between the first section and the second section. The plurality of first sub-pixels are located at one side of the transition section and the plurality of second sub-pixels are located at an opposite side of the transition section.

In one embodiment, the transition section has a stepped shape. In another embodiment, a shortest distance between the first sub-pixels and the first gate line is greater than a shortest distance between the first sub-pixels and the second gate line. A shortest distance between the second sub-pixels and the first gate line is smaller than a shortest distance between the second sub-pixels and the second gate line. The shortest distance between the first sub-pixels and the first gate line may be greater than half a nozzle pitch, the nozzle pitch being a distance between ink nozzles used to supply pigment to the first and second sub-pixels. The shortest distance between the first sub-pixels and the second gate line may be less than half the nozzle pitch.

In one embodiment, each first sub-pixel has organic material that is longer along a second direction than along the first direction. A plurality of first driving cells drive the first sub-pixels, the first driving cells arranged along the first direction in areas between adjacent first sub-pixels. The first driving cells may be arranged as pairs of first driving cells in the areas between adjacent first sub-pixels. Each pair of first driving cells may separated from an adjacent pair of first driving cells by two first sub-pixels.

In one embodiment, a method of fabricating an organic electroluminescent device is disclosed. The method comprises preparing a substrate that includes a row of sub-pixel areas arranged along a first direction, the sub-pixel areas including first sub-pixel areas and second sub-pixel areas. Pixel pigment is supplied through a first set of nozzles of a head to the first sub-pixel areas to form first light emitting sub-pixels. The pixel pigment is supplied through a second set of nozzles of the head to the second sub-pixel areas to form second light emitting sub-pixels that are offset from the first light emitting sub-pixels along a second direction perpendicular to the first direction.

In one embodiment, the first and second sets of nozzles are used alternately with each other during a single scanning operation of the head. In another embodiment, the first set of nozzles is used during a first scanning operation of the head, and then the second set of nozzles is used during a second scanning operation of the head.

In one embodiment, a pitch distance between the nozzles within the head is in a range of 65 μm~75 μm.

In one embodiment, the first set of nozzles and the second set of nozzles overlap by one or more nozzles and differ by one or more nozzles.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
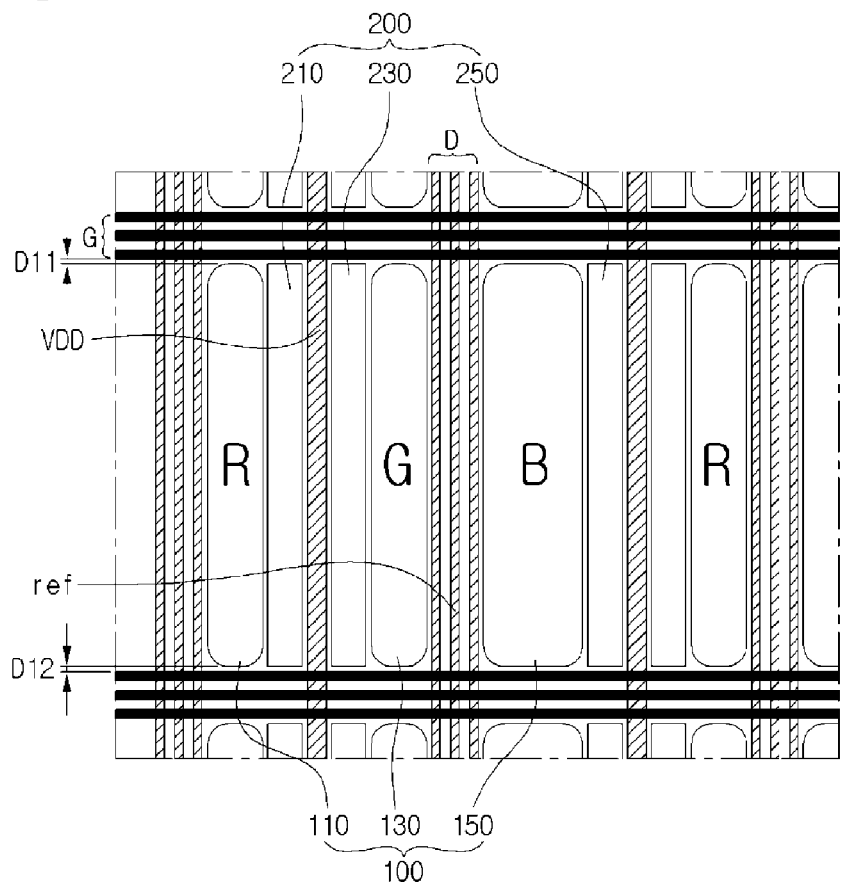
FIG. 1 is a planar view showing an organic electroluminescent device according to a first embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
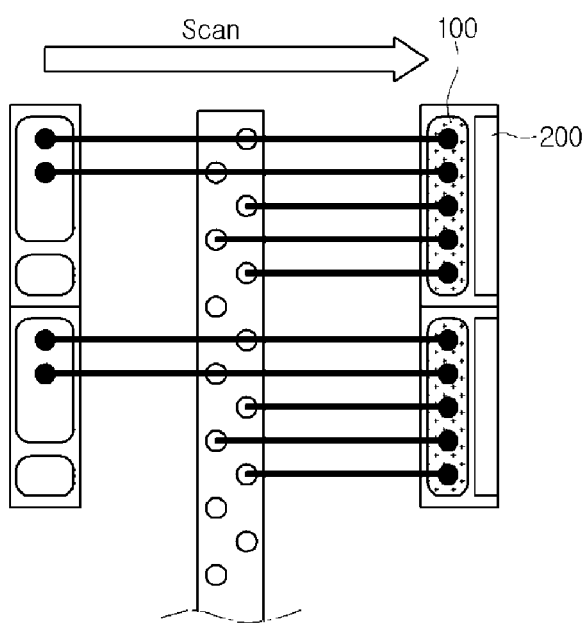
FIG. 2 is a diagram illustrating a method of forming an organic electroluminescent device in accordance with a first embodiment of the present disclosure.

FIG. 1 is a planar view showing an organic electroluminescent device according to a first embodiment of the present disclosure. FIG. 2 is a diagram illustrating a method of forming an organic electroluminescent device according to a first embodiment of the present disclosure.

Referring to FIG. 1, an organic electroluminescent device according to a first embodiment of the present disclosure can include sub-pixels 100 emitting red, green and blue lights, and driving cells 200 arranged between the sub-pixels 100.

Pixels can include a plurality of sub-pixels 100. The pixels can be defined as regions which are formed by gate lines G and data lines D crossing each other. The gate lines G can include a first gate line and a second gate line. The first gate line and the second gate line can be arranged in a top-and-bottom direction (i.e., a vertical direction) and being separated from each other.

The sub-pixels 100 can be disposed within the respective sub-pixel regions which are defined by the gate lines G, for example the first and second gate lines, and data lines D crossing each other. Also, sub-pixels can include a first sub-pixel, a second sub-pixel and a third sub-pixel. The first sub-pixel can be a red sub-pixel 110, the second sub-pixel can be a green sub-pixel 130, and the third sub-pixel can be a blue sub-pixel 150. Each of the sub-pixels 100 can be an organic light emission pattern layer. The organic light emission pattern layer is used to display one of red, green and blue. Organic materials emitting red, green and blue lights can be patterned within the respective sub-pixel regions and used as the organic light emission pattern layers.

The sub-pixels 100 can be arranged between the gate lines G which are arranged in the vertical direction and separated from one another. A distance between top edges of the sub-pixels 100 and a gate line G adjacent thereto can be the same as another distance between bottom edges of the sub-pixels 100 and another gate line G adjacent thereto.

Each of the sub-pixels 100 can be formed to be longer along a vertical direction. In other words, each of the sub-pixels 100 can be formed to have a vertical width that is larger than a horizontal width. Also, each of the sub-pixels 100 can be formed in an elliptical shape.

The data lines D can be disposed between two adjacent sub-pixels. In detail, the data lines D are arranged by pairs and each pair of data lines D is separated from adjacent pairs of data lines by two sub-pixels 100 (i.e., a two sub-pixel interval). A single reference voltage line Ref can be disposed between the two data lines D in a pair of data lines D.

Power supply lines VDD are also disposed between two adjacent sub-pixels 100. Each power line VDD is separated from adjacent power lines VDD by two sub-pixels 100 (i.e. a two sub-pixel interval). Also, the power supply line VDD can be disposed such that there is one sub-pixel 100 between the data line D. In other words, the power supply lines VDD and the pairs of data lines D can be arranged between the sub-pixels such that they alternate with each other. As such, the data line D can be disposed by one side edge of a sub-pixel 100, and the power supply line VDD can be disposed by the other side edge of the sub-pixel 100.

The driving cells 200 can be arranged in a row along the horizontal direction, where each driving cell 200 is located between two adjacent sub-pixels 100. In detail, the driving cells 200 are arranged by pairs, and each pair of driving cells 200 is separated from adjacent pairs of driving cells 200 by two sub-pixels 100 (i.e. a two sub-pixel interval). Moreover, the driving cells 200 can be arranged parallel to the data lines D. Such driving cells 200 are used to drive the respective sub-pixels 100. To this end, each of the driving cells 200 can include a switching thin film transistor, a driving thin film transistor and a storage capacitor (not shown). The switching thin film transistor is used to select the respective sub-pixel 100. The driving thin film transistor is used to drive an organic light emission cell (corresponding to the sub-pixel 199) in response to an electrical signal (i.e., a data signal) applied through the switching thin film transistor. The storage capacitor is used to maintain the electrical signal during a fixed period.

The driving cells 200 can be formed adjacent to the red, green and blue sub-pixels 110, 130 and 150. As such, the driving cells 200 can be arranged in areas between adjacent ones of the red, green and blue sub-pixels 110, 130 and 150. Such driving cells 200 can include a first driving cell 210, a second driving cell 230 and a third driving cell 250.

The first driving cell 210 can be disposed between the red sub-pixel 110 and the green sub-pixel 230. The second driving cell 230 can be disposed between the red sub-pixel 210 and the green sub-pixel 230. The first and second driving cells 210 and 230 can be arranged separately from each other. Also, the first driving cell 210 can be disposed adjacent to the red sub-pixel 110. The second driving cell 230 can be disposed adjacent to the green sub-pixel 130. Meanwhile, the third driving cell 250 can be disposed by a side edge of the blue sub-pixel 150. In other words, the third driving cell 250 can be disposed by the far side edge of the blue sub-pixel 150 that is opposite from the green sub-pixel 130.

Alternatively, the first through third driving cells 210, 230 and 250 can be arranged in one-to-one correspondence with the sub-pixels. In detail, the first driving cell 210 can be disposed between the red sub-pixel 110 and the green sub-pixel 130. The second driving cell 230 can be disposed between the green sub-pixel 130 and the blue sub-pixel 150. The third driving cell 250 can be disposed by a side edge of the blue sub-pixel 150. In other words, the third driving cell 250 can be disposed by the far side edge of the blue sub-pixel 150 opposite from the green sub-pixel 230.

If the driving cell 200 is disposed by a side of the respective sub-pixel 100, the length (the vertical width) of the sub-pixel 100 can be increased as shown in FIG. 2. For example, the left side of FIG. 2 shows sub-pixels that do not have increased length, and the right side of FIG. 2 shows sub-pixels that have increased length (vertical width). In accordance therewith, more ink (e.g., 4 or 5 drops) can be dropped into each of the sub-pixel regions during a single scanning operation through nozzles. This reduces the overall process time for manufacturing the display.

Figure 3:
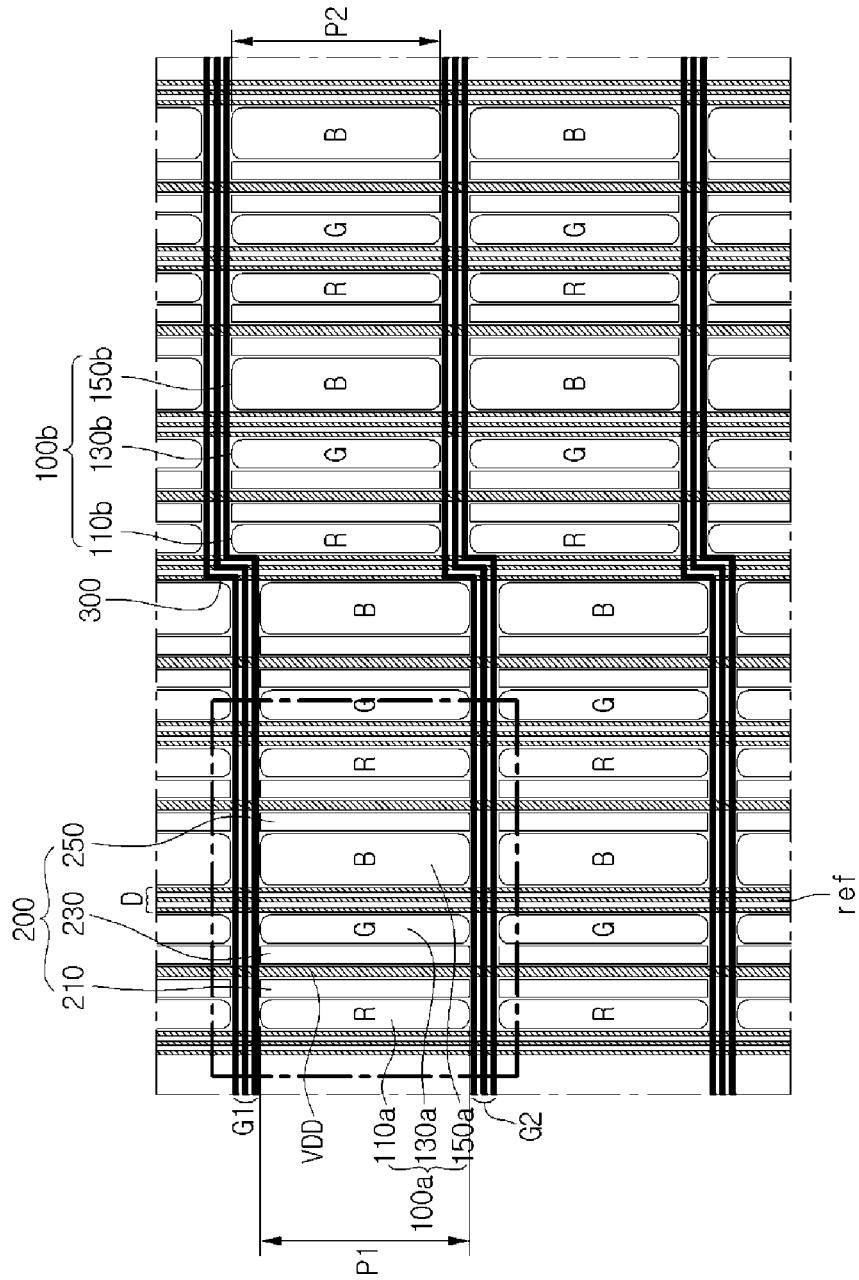
FIG. 3 is a planar view showing an organic electroluminescent device according to a second embodiment of the present disclosure.
Figure 4:
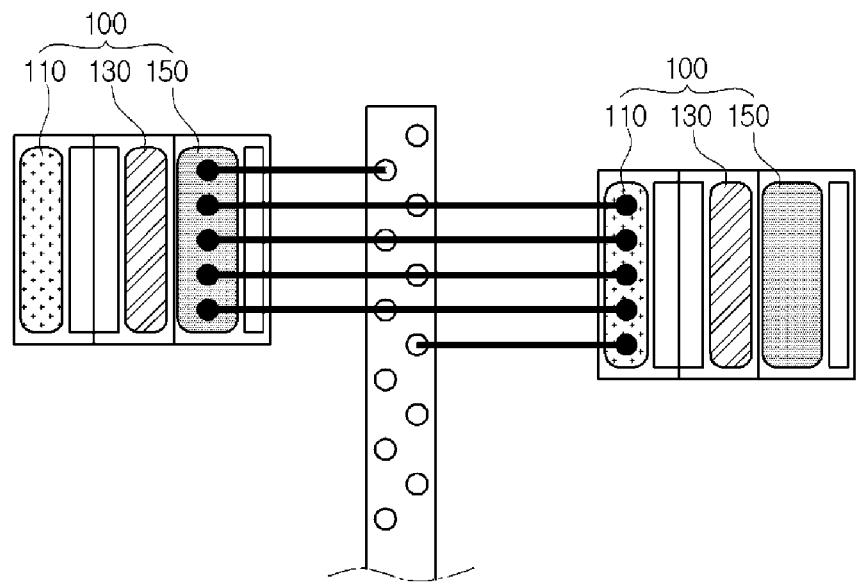
FIG. 4 is a diagram illustrating a method of forming an organic electroluminescent device in accordance with a second embodiment of the present disclosure.

FIG. 3 is a planar view showing an organic electroluminescent device according to a second embodiment of the present disclosure. FIG. 4 is a diagram illustrating a method of forming an organic electroluminescent device according to a second embodiment of the present disclosure.

Referring to FIG. 3, an organic electroluminescent device according to a second embodiment of the present disclosure can include sub-pixels 100a and 100b emitting red, green and blue light, and driving cells 200 arranged between the sub-pixels 100a and 100b. The description for components of the second embodiment opposite to those of the first embodiment will be omitted.

Gate lines G can include a first gate line G1 and a second gate line G2. The first gate line G1 is arranged above the second gate line G2 in a vertical direction. The first gate line G1 and the second gate line G2 are also separated from each other by a row of sub-pixels (e.g., 100a 100b). Also, the first gate line G1 and the second gate line G2 can be arranged parallel to each other and extend in a horizontal direction that is perpendicular to the vertical direction.

The sub-pixels 100a and 100b can include first sub-pixels 100a and second sub-pixels 100b. The first sub-pixels 100a can be arranged in a first pixel region P1. The first sub-pixels 100a can include red, green and blue sub-pixels 110a, 130a and 150a sequentially arranged along a horizontal direction. The second sub-pixels 100b can be arranged in a second pixel region P2. The second sub-pixels 100b can include red, green and blue sub-pixels 110b, 130b and 150b sequentially arranged along a horizontal direction.

The first gate line G1 and the second gate line G2 can be formed to have a stepped portion V. The stepped portion V divides the each gate line G into vertically offset sections. For example, for gate line G1, the section on the left side of the stepped portion V is vertically offset from the section on the right side of the stepped portion V. The distance between the first gate line G1 and the second gate line G2 can be constantly maintained across the display device.

The first pixel region P1 can be positioned in one side (e.g., a left side) of the stepped portion V. The second pixel region P2 can be positioned in the other side (e.g., a right side) of the stepped portion V. The first sub-pixels 100a can be arranged in the first pixel region P1. The second sub-pixels 100b can be arranged in the second pixel region P2. In other words, the first sub-pixels 100a and the second sub-pixels 100b can be arranged in different regions from that are separated by the stepped portion V.

There may be several stepped portions V (only one is shown in FIG. 3) such that groups of sub-pixels 100a and groups of sub-pixels 100b alternate with each other in a row along the horizontal direction. In other words, in a single row, a group of sub-pixels 100a may be followed by a group of offset sub-pixels 100b, which are then followed by another group of sub-pixels 100a, and so forth The stepped portion V is formed with a single stairstep shape, but it is not limited to this. In other words, the stepped portion V can be formed to have at least two stairsteps, a sloped shape, a curved shape or others. The stepped portion V may be referred as a transition region of the gate lines G since it creates a transition between vertically offset sections of the gate lines G.

The driving cells 200 can be arranged between the sub-pixels 100. Also, the driving cells 200 can be arranged parallel to the data lines D. In detail, the driving cells 200 can be arranged between the red, green and blue sub-pixels 110, 130 and 150. Such a driving cell 200 is used to drive the respective sub-pixel 100. To this end, each of the driving cells 200 can include a switching thin film transistor, a driving thin film transistor and a storage capacitor (not shown). The switching thin film transistor is used to select the respective sub-pixel 100. The driving thin film transistor is used to drive an organic light emission cell (corresponding to the sub-pixel) in response to an electrical signal (i.e., a data signal) applied through the switching thin film transistor. The storage capacitor is used to maintain the electrical signal during a fixed period.

In this manner, the first and second sub-pixels 100a and 100b are offset from each other at different vertical positions. As such, each of the sub-pixels 100 can receive ink through different nozzles from one another as shown in FIG. 4. Supplying ink to sub-pixels 100 that are aligned in a row (as shown in FIG. 1) can sometimes result in uneven stain distribution that appears as a visible stain pattern across the sub-pixels. However, by staggering the sub-pixels and supplying ink to the sub-pixels through different groups of nozzles (as shown in FIG. 3-4), the stain patterns can be prevented. In accordance therewith, deviation between the ink quantities within the sub-pixels 100 can be minimized.

Figure 5:
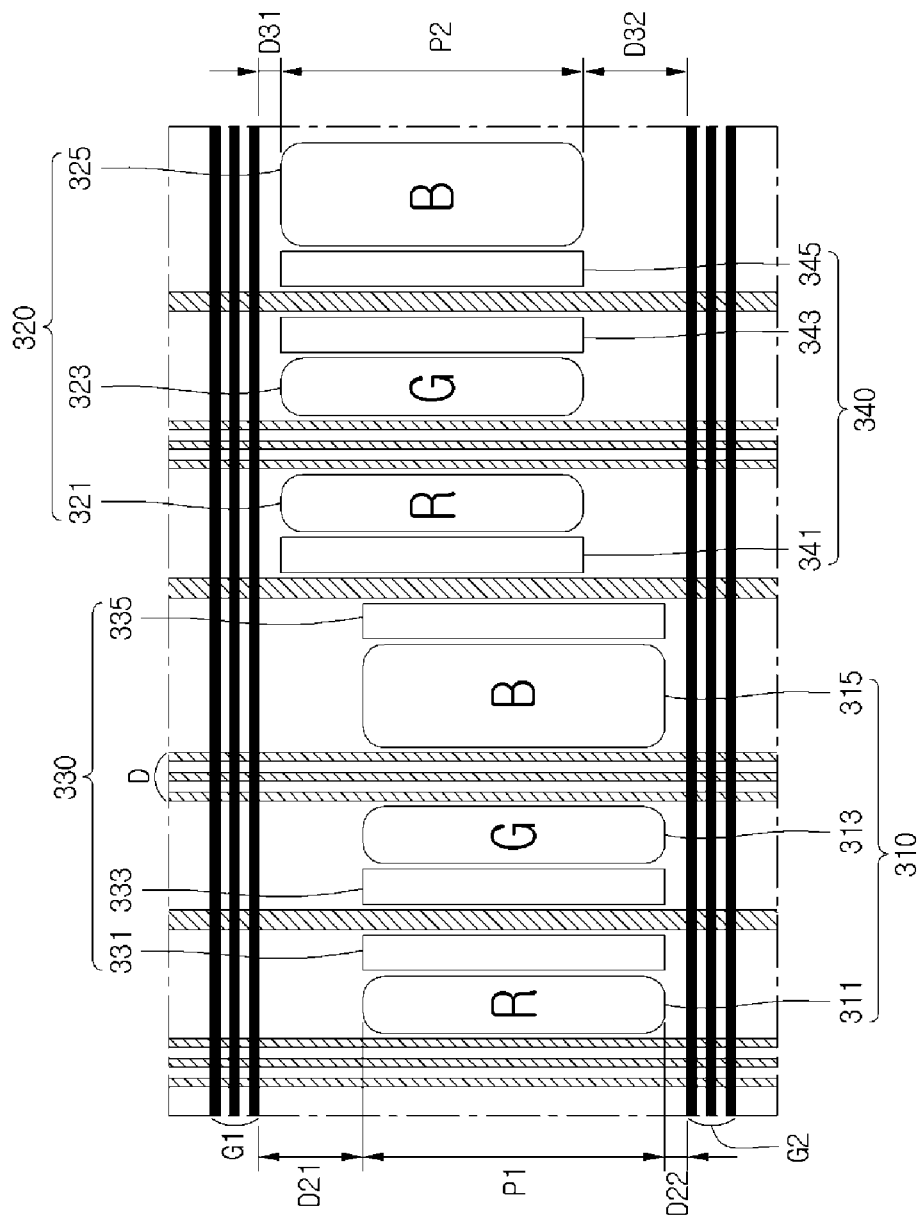
FIG. 5 is a planar view showing an organic electroluminescent device according to a third embodiment of the present disclosure.

FIG. 5 is a planar view showing an organic electroluminescent device according to a third embodiment of the present disclosure.

Referring to FIG. 5, an organic electroluminescent device according to a third embodiment of the present disclosure can include: first and second pixel regions P1 and P2 defined by first and second gate lines G1 and G2 and the data lines D crossing each other; first sub-pixels 310 arranged in the first pixel region P1 adjacent to the first gate line G1; first driving cells 330 arranged between the first sub-pixels 310; second sub-pixels 320 arranged in the second pixel region P2; and second driving cells 340 arranged between the second sub-pixels 320. The description for components of the third embodiment overlapping with those of the first and second embodiments will be omitted.

The first gate line G1 is arranged above the second gate line G1 in a vertical direction. The first gate line G1 and the second gate line G2 can be separate from each other. Also, the first gate line G1 and the second gate line G2 can be arranged parallel to each other.

The first sub-pixels 310 arranged in the first pixel region P1 can include red, green and blue sub-pixels 311, 313 and 315 sequentially arranged in a horizontal direction. The first pixel region P1 can be a region that is closer to the second gate line G2. In other words, a closest distance D21 between a top edge of the first pixel region P1 and the first gate line G1 can be larger than a closest distance D22 between the bottom edge of the first pixel region P1 and the second gate line G2.

As such, the distance D21 between the first sub-pixels 310 and the first gate line G1 can become larger than the distance D22 between the first sub-pixels 310 and the second gate line G2. The distance D21 between the first sub-pixels 310 and the first gate line G1 can be more than 35 μm. The distance D22 between the first sub-pixels 310 and the second gate line G2 can be no more than 35 μm.

The distance D21 between the first sub-pixels 310 and the first gate line G1 and the distance D22 between the first sub-pixels 310 and the second gate line G2 depend on a vertical nozzle pitch distance between nozzles which are used to supply red, green and pigments into the pixel regions.

For example, the distance between the nozzles can be a range of about 65 μm~75 μm The distance D21 between the first sub-pixels 310 and the first gate line G1 can be greater than half the pitch distance between the nozzles. The distance D22 between the first sub-pixels 310 and the second gate line G2 can be less than half the pitch distance between the nozzles.

The second sub-pixels 320 arranged in the second pixel region P2 can include red, green and blue sub-pixels 321, 323 and 325 sequentially arranged. The second pixel region P2 can be another region close to the first gate line G1. A shortest distance D31 between a top edge of the second pixel region P2 and the first gate line G1 can be smaller than a shortest distance D32 between a bottom edge of the second pixel region P2 and the second gate line G2.

The distance D31 between the second sub-pixels 320 and the first gate line G1 can be no more than 35 μm. The distance D32 between the second sub-pixels 320 and the second gate line G2 can be more than 35 μm.

The first driving cells 330 can be arranged between the first sub-pixels 310. In other words, the first driving cells 330 can include a plurality of first driving cells 331, 333 and 335 arranged between the first sub-pixels 310. The plurality of first driving cells 331, 333 and 335 are used to drive the red, green and blue sub-pixels 311, 313 and 315 included in the first sub-pixels 310. To this end, the first driving cells 331, 333 and 335 can be arranged by side edges of the red sub-pixel 311, the green sub-pixel 313 and the blue sub-pixel 315.

The second driving cells 340 can be arranged between the second sub-pixels 320. In other words, the second driving cells 340 can include a plurality of second driving cells 341, 343 and 345 arranged between the second sub-pixels 320. The plurality of second driving cells 341, 343 and 345 are used to drive the red, green and blue sub-pixels 321, 323 and 325 included in the second sub-pixels 320. To this end, the second driving cells 341, 343 and 345 can be arranged by side edges of the red sub-pixel 321, the green sub-pixel 323 and the blue sub-pixel 325.

The organic electroluminescent device the third embodiment allows the red, green and blue sub-pixels to be arranged on different regions from each other in groups. As such, the generation of stains due to deviation of the ink supply quantity can be prevented.

As shown in FIG. 5, sub-pixels 310 are vertically offset from sub-pixels 320. The amount of the offset can vary depending on a nozzle pitch distance between the ink nozzles. In one embodiment, sub-pixels 310 are vertically offset from sub-pixels 320 by more than half the nozzle pitch distance. In FIG. 3, the sub-pixels 100a may also be offset from sub-pixels 100b by more than half the nozzle pitch distance.

Subsequently, methods of fabricating an organic electroluminescent device in accordance with a third embodiment of the present disclosure will be explained with reference to FIGS. 6 through 9.

Figure 6:
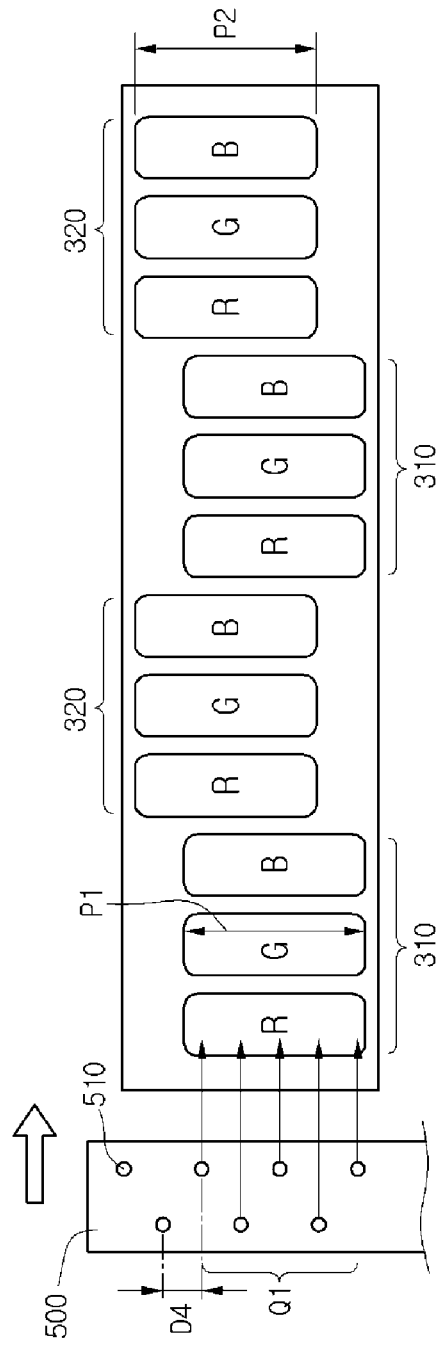
FIGS. 6 and 7 are diagrams illustrating a method of fabricating an organic electroluminescent device in accordance with a third embodiment of the present disclosure.
Figure 7:
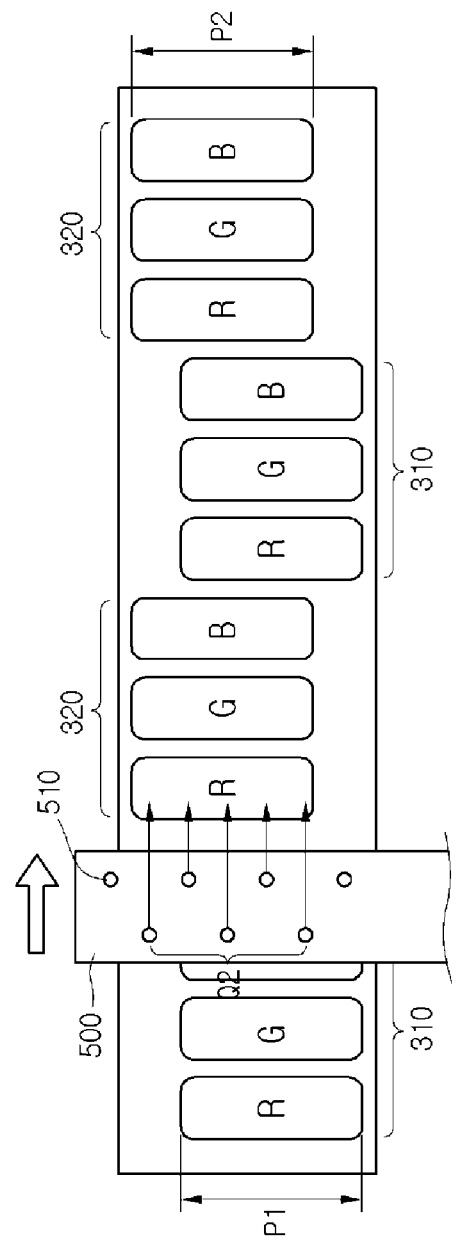

FIGS. 6 and 7 are diagrams illustrating a method of fabricating an organic electroluminescent device in accordance with a third embodiment of the present disclosure.

A method of fabricating an organic electroluminescent device in accordance with the third embodiment can include preparing a substrate which includes a row of sub-pixel areas arranged along a horizontal direction. The row of sub-pixel areas includes first sub-pixel areas arranged in first pixel regions and second sub-pixel areas arranged in second pixel regions. Pixel pigment is supplied through a first set of nozzles of a head to first sub-pixel areas to form first sub-pixels. Pixel pigment is also supplied through a second set of nozzles of the head to second sub-pixel areas to form second sub-pixels. The first sub-pixel areas are vertically offset from the second sub-pixels areas, which results in first sub-pixels that are vertically offset from the second sub-pixels.

As shown in FIG. 6, when the substrate is prepared, a head 500 scans sub-pixel areas for the first sub-pixels 310 arranged in one of the first pixel regions P1 and injects pigments to form red, green and blue sub-pixels 311, 313 and 315 arranged in a first pixel region P1. Although a single head is shown in the drawing for the convenience of explanation, three heads connected to one another can be used in order to supply different color pigments into the red, green and blue sub-pixel areas.

The head can include a first set of nozzles Q1 corresponding to the first sub-pixels 310. The first set of nozzles Q1 can include five nozzles 510. The vertical pitch distance D4 between the nozzles 510 can be set to a range of about 65 μm~75 μm.

When the pigment supply for the first sub-pixels 310 on one of the first pixel regions P1 through the first set of nozzles Q1 of the head 500 is completed, the head 500 can supply the pigments to form the second sub-pixels 320 on one of the second pixel regions P2 as shown in FIG. 7. In this time, the sub-pixel areas for the second sub-pixels 320 can receive the pigments from a second set of nozzles Q2 of the head 500.

The second set of nozzles Q2 also includes five nozzles 510. The second set of nozzles Q2 may overlap with and share some of the same nozzles 510 as the first set of nozzles Q1. However, the second set of nozzles Q2 includes at least one nozzle 510 that is not in the first set of nozzles Q1. Similarly, the first set of nozzles Q1 includes at least one nozzle 510 that is not in the second set of nozzles Q2.

The head 500 can supply the pigments to sub-pixel areas for the first sub-pixels 320 arranged within another one of the first pixel regions P1 through the first set of nozzles Q1 in the same manner as shown in FIG. 6, after the pigment supply for the second sub-pixels 320 on one of the second pixel region P2 through the second set of nozzles Q2 of the head 500 is completed.

In this way, the head 500 alternately uses the first set of nozzles Q1 and the second set of nozzles Q2 during a single scanning operation, which is one pass of the head 500 across the substrate. As such, the pigments can be stably supplied to sub-pixel areas for the first sub-pixels 310 and sub-pixel areas for the second sub-pixels 320. Therefore, deviation between pigment quantities supplied to form the first and second sub-pixels 310 and 320 can be minimized.

Figure 8:
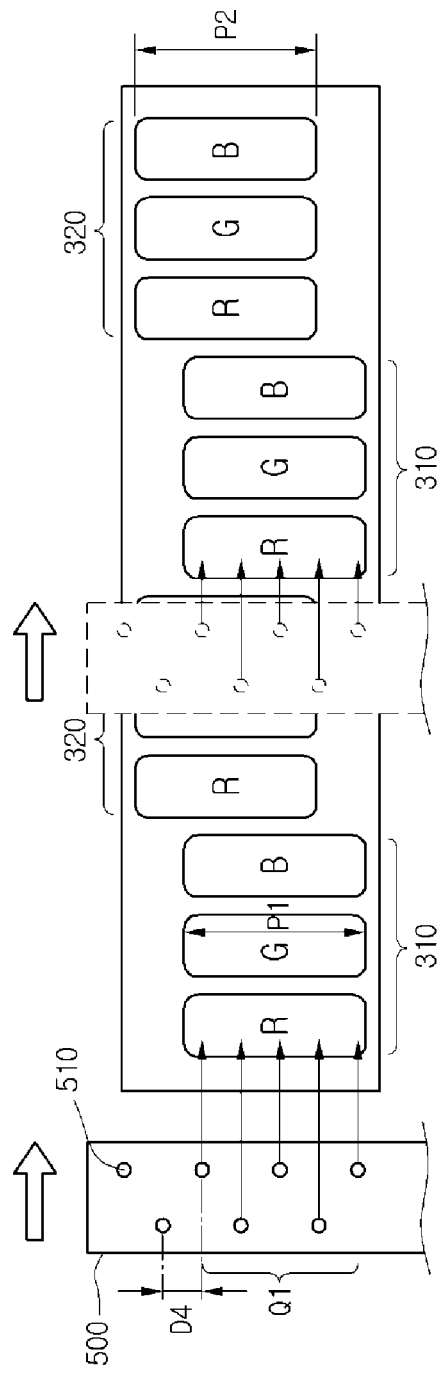
FIGS. 8 and 9 are diagrams illustrating another method of fabricating an organic electroluminescent device in accordance with to a third embodiment of the present disclosure.
Figure 9:
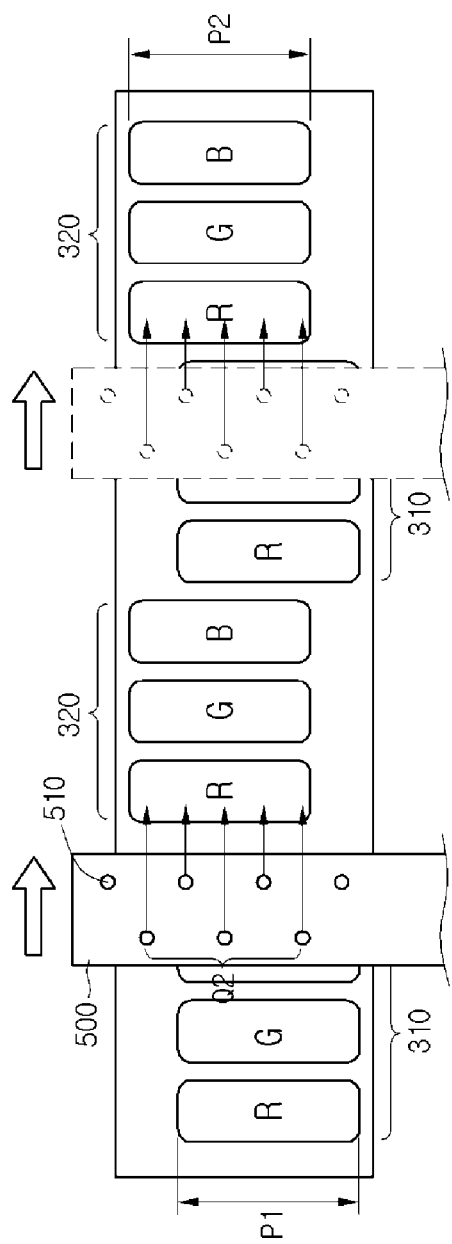

FIGS. 8 and 9 are diagrams illustrating another method of fabricating an organic electroluminescent device in accordance with to a third embodiment of the present disclosure.

As shown in FIG. 8, when the substrate is prepared, a head 500 sequentially scans sub-pixel areas for the first sub-pixels 310 arranged in first pixel regions P1 and sequentially injects pigments into red, green and blue sub-pixel areas arranged in the first pixel regions P1 using a first set of nozzles Q1. Although a single head is shown in the drawing for the convenience of explanation, three heads connected to one another can be used in order to supply different pigments into the red, green and blue sub-pixels.

At this time, the sub-pixel areas for first sub-pixels 310 arranged in the first pixel regions P1 are sequentially scanned by the head and filled with the pigment. However, although second sub-pixel areas for the second sub-pixels 320 are also sequentially scanned by the head, the pigment is not supplied into the second sub-pixel areas for second sub-pixels 320 at this time.

When the sequential pigment supply for the first sub-pixels 310 on the first pixel regions P1 through the first set of nozzles Q1 of the head 500 is completed, the head 500 returns to a starting position at the left side of the substrate. Also, the head 500 is moved to the start portion of the second sub-pixels 320 arranged in the second pixel regions P2. Subsequently, the head 500 sequentially scans sub-pixel areas for the second sub-pixels 320 arranged in the second pixel regions P2 and supplies the pigments into the second sub-pixel areas to form the second sub-pixels 320 through a second set of nozzles Q2. At the same time, the pigments are not supplied to first sub-pixel areas for the first sub-pixels 310 even though the first sub-pixels 310 are scanned by the head 500.

As described above, the head 500 can alternately supply the pigments to the first sub-pixels 310 and the second sub-pixels 320 during a single scanning operation, thereby fabricating an organic electroluminescent device. Alternatively, in order to fabricate an organic electroluminescent device, the head 500 can supply the pigments to the first sub-pixels 310 during a first scanning operation and then supply the pigments to the second sub-pixels 320 during a second scanning operation.

Figure 10:
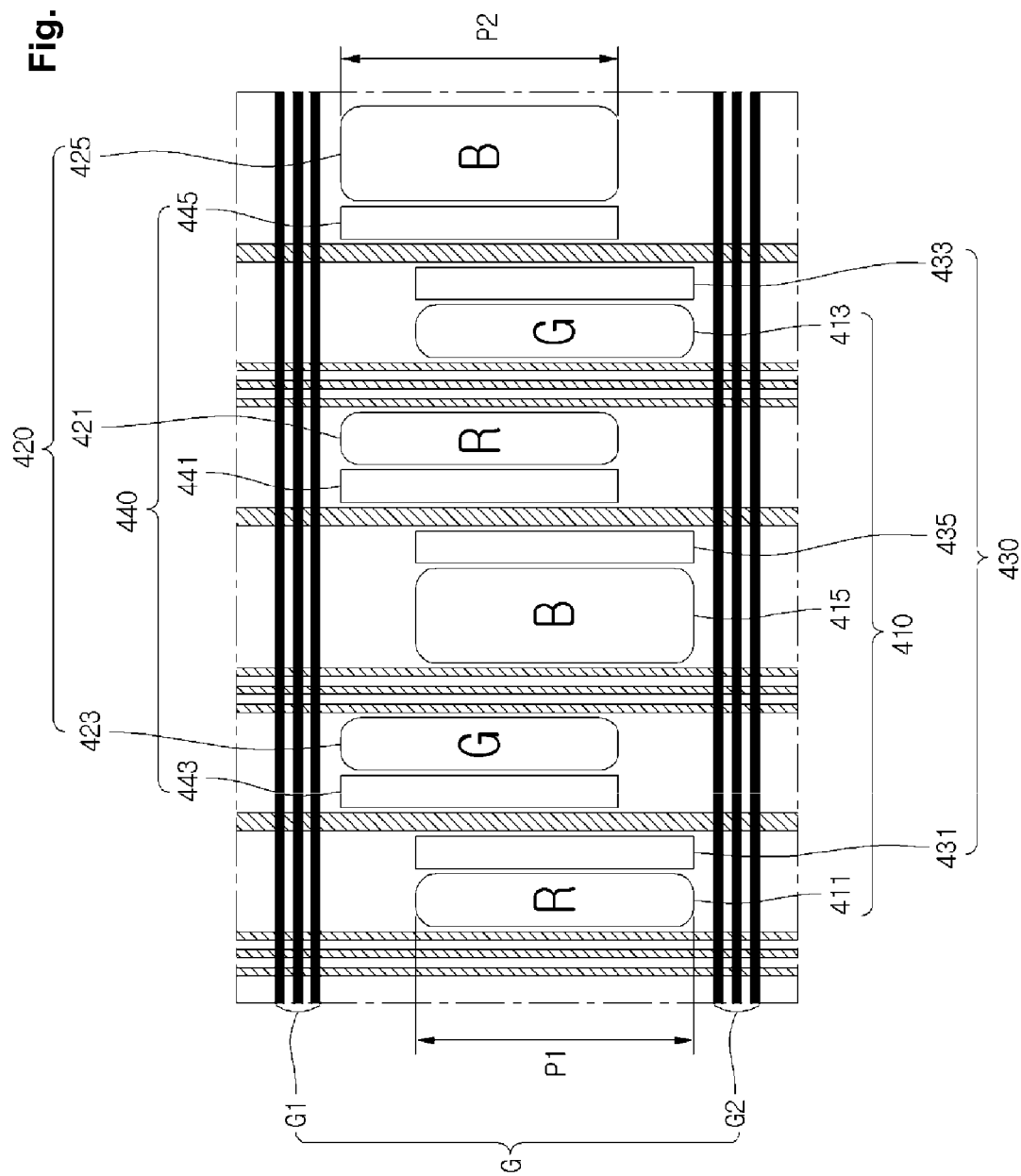
FIG. 10 is a planar view showing an organic electroluminescent device according to a fourth embodiment of the present disclosure.

FIG. 10 is a planar view showing an organic electroluminescent device according to a fourth embodiment of the present disclosure.

Referring to FIG. 10, an organic electroluminescent device according to a fourth embodiment of the present disclosure can include: first and second pixel regions P1 and P2 defined by first and second gate lines G1 and G2 and the data lines D crossing each other; first sub-pixels 410 arranged in the first pixel region P1 adjacent to the first gate line G1; first driving cells 430 arranged between the first sub-pixels 410; second sub-pixels 420 arranged in the second pixel region P2; and second driving cells 440 arranged between the second sub-pixels 420. The description for components of the third embodiment overlapping with those of the third embodiment will be omitted.

The first gate line G1 is arranged above the second gate line G1 in a vertical direction. The first gate line G1 and the second gate line G2 can be separate from each other. Also, the first gate line G1 and the second gate line G2 can be arranged parallel to each other.

The first sub-pixels 410 can be arranged in the first pixel region P1. The first pixel region P1 can be a region closer to the second gate line G2. A distance between the top edge of the first pixel region P1 and the first gate line G1 can become larger than another distance between the bottom edge of the first pixel region P1 and the second gate line G2.

The second sub-pixels 520 can be arranged in the second pixel region P2. The second pixel region P2 can be another region closer to the first gate line G1. A distance between the top edge of the second pixel region P2 and the first gate line G1 can be smaller than a distance between a bottom edge of the second pixel region P2 and the second gate line G2.

The first sub-pixels 410 can include red, green and blue sub-pixels 411, 413 and 415. The first sub-pixels 410 can be arranged alternately with the second sub-pixels 420. In detail, a green sub-pixel 423 of the second sub-pixels 420 can be disposed between the red sub-pixel 411 of the first sub-pixels 410 and the blue sub-pixel 415 of the first sub-pixels 410. A red sub-pixel 421 of the second sub-pixels 420 can be disposed between the blue sub-pixel 415 and the green sub-pixel 413 of the first sub-pixels 410. A blue sub-pixel 425 of the second sub-pixels 420 can be disposed by a side of the green sub-pixel 413 of the first sub-pixels 410.

In this way, the organic electroluminescent device the fourth embodiment allows the red, green and blue sub-pixels to be arranged alternately from one another in different regions from each other. In other words, individual sub-pixels 410 alternate with individual sub-pixels 420 along the horizontal direction. As such, the generation of stains due to deviation of the ink supply quantity can be prevented.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic electroluminescent device comprising:
   a plurality of first light emitting sub-pixels arranged in a row along a first direction;

a plurality of second light emitting sub-pixels arranged in the row along the first direction, the first light emitting sub-pixels being offset from the second light emitting sub-pixels in a second direction that is perpendicular to the first direction; and a first gate line extending along the first direction and adjacent to a first side of the row, the first gate line including a first section, a second section offset from the first section in the second direction, and a transition section between the first section and the second section.

2. The organic electroluminescent device of claim 1, wherein the first sub-pixels are offset from the second sub-pixels by more than half a nozzle pitch, the nozzle pitch being a distance between ink nozzles used to supply pigment onto the first and second sub-pixels.

3. The organic electroluminescent device of claim 1, wherein groups of the first sub-pixels alternate with groups of the second sub-pixels along the first direction.

4. The organic electroluminescent device of claim 1, wherein individual first sub-pixels alternate with individual second sub-pixels along the first direction.

5. The organic electroluminescent device of claim 1, further comprising:

a second gate line extending along the first direction and adjacent to a second side of the row.

6. The organic electroluminescent device of claim 1, wherein, the plurality of first sub-pixels are located at one side of the transition section and the plurality of second sub-pixels are located at an opposite side of the transition section.

7. The organic electroluminescent device of claim 6, wherein the transition section has a stepped shape.

8. An organic electroluminescent device comprising:

a plurality of first light emitting sub-pixels arranged in a row along a first direction;

a plurality of second light emitting sub-pixels arranged in the row along the first direction, the first light emitting sub-pixels being offset from the second light emitting sub-pixels in a second direction that is perpendicular to the first direction;

a first gate line extending along the first direction and adjacent to a first side of the row; and a second gate line extending along the first direction and adjacent to a second side of the row, a shortest distance between the first sub-pixels and the first gate line being greater than a shortest distance between the first sub-pixels and the second gate line, and a shortest distance between the second sub-pixels and the first gate line being smaller than a shortest distance between the second sub-pixels and the second gate line.

9. The organic electroluminescent device of claim 8, wherein the shortest distance between the first sub-pixels and the first gate line is greater than half a nozzle pitch, the nozzle pitch being a distance between ink nozzles used to supply pigment to the first and second sub-pixels, and the shortest distance between the first sub-pixels and the second gate line is less than half the nozzle pitch.

10. An organic electroluminescent device comprising:

a plurality of first light emitting sub-pixels arranged in a row along a first direction, each of the plurality of first light emitting sub-pixel including organic material that is longer along a second direction than along the first direction;

a plurality of second light emitting sub-pixels arranged in the row along the first direction, the first light emitting sub-pixels being offset from the second light emitting sub-pixels in the second direction that is perpendicular to the first direction; and a plurality of driving cells to drive the first sub-pixels, the driving cells arranged along the first direction in areas between adjacent first sub-pixels.

11. The organic electroluminescent device of claim 10, wherein the driving cells are arranged as pairs of driving cells in the areas between adjacent first sub-pixels.

12. The organic electroluminescent device of claim 11, wherein each pair of driving cells is separated from an adjacent pair of driving cells by two first sub-pixels.

* * * * *